United States Patent
Noda et al.

(10) Patent No.: US 9,362,431 B2
(45) Date of Patent: Jun. 7, 2016

(54) COMPOUND SEMICONDUCTOR SINGLE CRYSTAL INGOT FOR PHOTOELECTRIC CONVERSION DEVICES, PHOTOELECTRIC CONVERSION DEVICE, AND PRODUCTION METHOD FOR COMPOUND SEMICONDUCTOR SINGLE CRYSTAL INGOT FOR PHOTOELECTRIC CONVERSION DEVICES

(71) Applicant: JX NIPPON MINING & METALS CORPORATION, Tokyo (JP)

(72) Inventors: Akira Noda, Kitaibaraki (JP); Ryuichi Hirano, Tokyo (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 14/780,921

(22) PCT Filed: Mar. 11, 2014

(86) PCT No.: PCT/JP2014/056230
§ 371 (c)(1),
(2) Date: Sep. 28, 2015

(87) PCT Pub. No.: WO2014/156597
PCT Pub. Date: Oct. 2, 2014

(65) Prior Publication Data
US 2016/0056313 A1   Feb. 25, 2016

(30) Foreign Application Priority Data
Mar. 29, 2013  (JP) .................................. 2013-072838

(51) Int. Cl.
*G01T 1/20* (2006.01)
*H01L 31/036* (2006.01)
(Continued)

(52) U.S. Cl.
CPC .............. *H01L 31/036* (2013.01); *C30B 11/00* (2013.01); *C30B 11/002* (2013.01);
(Continued)

(58) Field of Classification Search
CPC .. H01L 31/063; H01L 31/02863; H01L 31/04
USPC ....................................................... 250/370.01
See application file for complete search history.

(56) References Cited

U.S. PATENT DOCUMENTS 4,734,381 A * 3/1988 Mitchell ................. H01L 21/44
136/256
2006/0060132 A1   3/2006 Hata
(Continued)

FOREIGN PATENT DOCUMENTS

JP   2-255600 A   10/1990
JP   5-347425 A   12/1993
(Continued)

OTHER PUBLICATIONS

Taiwanese Office Action and Search Report, issued Dec. 8, 2015, for Taiwanese Application No. 103111457, along with English translations.
(Continued)

*Primary Examiner* — David Porta
*Assistant Examiner* — Meenakshi Sahu
(74) *Attorney, Agent, or Firm* — Birch, Stewart, Kolasch & Birch, LLP

(57) ABSTRACT

The present invention increases the conversion efficiency of a photoelectric conversion element that uses cadmium zinc telluride or cadmium telluride (Cd(Zn)Te) compound semiconductor single crystals containing a group 1A element as an impurity. A heat-resistant pot is filled with raw material and a group 1A element, which is reacted with a portion of the raw material, and the container is heated, thereby melting the raw material into a melt and diffusing the dissociated group 1A element in the melt, producing single crystals from the melt. Compound semiconductor single crystals for photoelectric conversion elements having a hole concentration of $4 \times 10^{15}$ $cm^{-3}$ to $1 \times 10^{18}$ $cm^{-3}$ are produced in this manner. Using a substrate (2) that has been cut out from the compound semiconductor single crystals for photoelectric conversion elements enables the conversion efficiency of a photoelectric conversion element (10) to be increased.

12 Claims, 1 Drawing Sheet

(51) Int. Cl.
  *C30B 11/00* (2006.01)
  *C30B 29/48* (2006.01)
  *H01L 31/073* (2012.01)
  *H01L 31/0296* (2006.01)
  *H01L 31/18* (2006.01)
  *C30B 11/06* (2006.01)
  *H01L 31/04* (2014.01)

(52) U.S. Cl.
  CPC .............. *C30B 11/065* (2013.01); *C30B 29/48* (2013.01); *H01L 31/02963* (2013.01); *H01L 31/02966* (2013.01); *H01L 31/04* (2013.01); *H01L 31/073* (2013.01); *H01L 31/1832* (2013.01); *Y02E 10/543* (2013.01)

(56) References Cited

U.S. PATENT DOCUMENTS

2008/0102022 A1　5/2008　Arakawa et al.
2010/0008393 A1　1/2010　Enya et al.
2010/0261306 A1*　10/2010　Schwartz ............ H01L 31/0296
　　　　　　　　　　　　　　　　　　　　438/89

FOREIGN PATENT DOCUMENTS

| JP | 8-133898 A | 5/1996 |
| JP | 9-74210 A | 3/1997 |
| JP | 11-228299 A | 8/1999 |
| JP | 2001-226200 A | 8/2001 |
| JP | 2013-84921 A | 5/2013 |
| TW | 200419675 A | 10/2004 |
| TW | 201011952 A1 | 3/2010 |
| TW | 201240911 A1 | 10/2012 |
| WO | WO 2012/114803 A1 | 8/2012 |

OTHER PUBLICATIONS

International Search Report, mailed Jun. 17, 2014, issued in PCT/JP2014/056230.

* cited by examiner

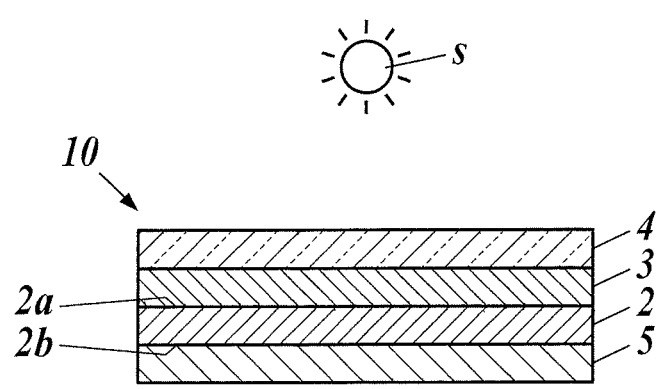

COMPOUND SEMICONDUCTOR SINGLE CRYSTAL INGOT FOR PHOTOELECTRIC CONVERSION DEVICES, PHOTOELECTRIC CONVERSION DEVICE, AND PRODUCTION METHOD FOR COMPOUND SEMICONDUCTOR SINGLE CRYSTAL INGOT FOR PHOTOELECTRIC CONVERSION DEVICES

CROSS REFERENCE TO RELATED APPLICATIONS

This application is the National Phase of PCT/JP2014/056230 filed on Mar. 11, 2014, which claims priority under 35 U.S.C. 119(a) to Patent Application No. 2013-072838, filed in Japan on Mar. 29, 2013, all of which are hereby expressly incorporated by reference into the present application.

TECHNICAL FIELD

The present invention relates to a compound semiconductor single crystal ingot used in photoelectric conversion devices of solar cells, a photoelectric conversion device using a substrate cut out from this compound semiconductor single crystal ingot, and a method for producing this compound semiconductor single crystal ingot.

BACKGROUND ART

Group II-VI compound semiconductors such as cadmium telluride (CdTe) and cadmium zinc telluride (CdZnTe) are known as semiconductor materials for forming substrates of devices for detecting radiation or infrared rays. Crystals of CdTe and CdZnTe (hereafter "Cd(Zn)Te") containing no impurity (undoped) or containing a group 1A element, such as sodium (Na) or lithium (Li), show p-type electric properties. In other words, a p-type Cd(Zn)Te crystal can be prepared by adding an appropriate amount of impurity, such as Na or Li, to the crystal.

A trace amount of Na or Li, which is contained in the quartz component of a crucible used for producing crystals, intrudes a Cd(Zn)Te crystal during its production process without intentions of manufacturers. The concentrations of these impurities, however, must be reduced in production of the Cd(Zn)Te crystal for a radiation detecting device. Thus, the solidification rate of Cd(Zn)Te has been limited for growing a Cd(Zn)Te crystal, in other words, its crystal growth has been finished before the melt has completely solidified, so as to leave Na and Li in the melt (see Patent document 1).

RELATED ART DOCUMENTS

Patent Documents

[Patent Document 1] Japanese Patent Application Laid-Open No. 11-228299
[Patent Document 2] Japanese Patent Application Laid-Open No. 05-347425
[Patent Document 3] Japanese Patent Application Laid-Open No. 09-074210
[Patent Document 4] WO2012-114803

SUMMARY OF THE INVENTION

Problems to be Solved by the Invention

The Cd(Zn)Te crystal is also used as substrate materials for cells (photoelectric conversion devices) of solar cells. A photoelectric conversion device including a Cd(Zn)Te crystal has been proposed and developed which has a structure including a p-type semiconductor layer made of a Cd(Zn)Te crystal, an n-type semiconductor layer made of, for example, cadmium sulfide (CdS), a front electrode, and a rear electrode (see Patent documents 2 and 3). Photoelectric conversion devices including substrates made of a Cd(Zn)Te crystal can be produced by a simple manufacturing process at significantly low manufacturing cost compared to devices produced with any other material, such as silicon (Si), and their future market expansion is expected.

The Cd(Zn)Te crystal for photoelectric conversion devices must have a reduced resistivity unlike radiation detecting devices used under high voltage. It is known that the carrier concentration in the crystal should be increased to reduce the resistivity. The increased carrier concentration also leads to improved conversion efficiency. Thus, in the production of a Cd(Zn)Te crystal containing Na or Li for photoelectric conversion devices, the Na or Li concentration in the crystal is increased without control of diffusion of Na or Li to a crucible.

Such addition of Na or Li, however, limits the hole concentration to about $1\times10^{15}$ cm$^{-3}$ at most, which causes the conversion efficiency of the photoelectric conversion device to be lowered compared to those prepared with any other semiconductor crystal such as Si.

Polycrystalline CdTe thin films have been produced from powdered CdTe having an acceptor concentration in the range of $1\times10^{17}$ cm$^{-3}$ to $1\times10^{18}$ cm$^{-3}$ by a close-spaced sublimation (CSS) method (Patent document 4).

This patent document, however, discloses only an example using antimony as an acceptor and thus it is not clear that a desired acceptor concentration can be achieved using Na or Li as an impurity. Furthermore, only a polycrystalline thin film can be produced by this method. Since a large number of grain boundaries are present in the polycrystalline matrix, carriers produced by photoexcitation are readily scattered, which shortens the carrier lifetime. As a result, polycrystalline solar cells cannot have high conversion efficiency compared to monocrystalline cells.

A recent demand is to further improve the conversion efficiency of a photoelectric conversion device of Cd(Zn)Te. At present, however, a method for efficiently incorporating Na or Li to a single crystal has not been developed yet other than utilizing diffusion of Na or Li from a crucible as described in Patent document 1.

An object of the present invention, which has been made to solve the above problems, is to improve the conversion efficiency of a photoelectric conversion device including using a substrate cut out from a compound semiconductor single crystal ingot containing at least one group 1A impurity element.

Means for Solving the Problems

The invention of claim 1 is a compound semiconductor single crystal ingot of cadmium telluride or cadmium zinc telluride for a photoelectric conversion device containing at least one group 1A impurity element and having a hole concentration in the range of $4\times10^{15}$ cm$^{-3}$ to $1\times10^{18}$ cm$^{-3}$.

The invention of claim 2 is the compound semiconductor single crystal ingot for a photoelectric conversion device according to claim 1, wherein the at least one group 1A element includes sodium and the concentration of the sodium ranges from $2\times10^{15}$ cm$^{-3}$ to $1\times10^{20}$ cm$^{-3}$.

The invention of claim 3 is the compound semiconductor single crystal ingot for a photoelectric conversion device according to claim 2, wherein the at least one group 1A element includes sodium and lithium and the concentration of the lithium ranges from $2\times10^{15}$ cm$^{-3}$ to $1\times10^{20}$ cm$^{-3}$.

The invention of claim 4 is the compound semiconductor single crystal ingot for a photoelectric conversion device according to claim 1, wherein the at least one group 1A element includes lithium and the concentration of the lithium ranges from $2\times10^{15}$ cm$^{-3}$ to $1\times10^{20}$ cm$^{-3}$.

The invention of claim 6 is a photoelectric conversion device: including a p-type semiconductor substrate cut out from a compound semiconductor single crystal ingot for a photoelectric conversion device according to any one of the claims 1 to 5, an n-type semiconductor layer formed on a first main surface of the p-type semiconductor substrate, a first electrode formed on a surface of the n-type semiconductor layer, and a second electrode formed on a second main surface of the p-type semiconductor substrate.

The invention of claim 7 is a method for producing a compound semiconductor single crystal ingot of cadmium telluride or cadmium zinc telluride for a photoelectric conversion device containing at least one group 1A impurity element, the method including: filling a heat-resistant pot (crucible) with a raw material and a group 1A element reacting combined with part of the raw material, melting the raw material to obtain a melt by heating the pot, and diffusing the dissociated group 1A element into the melt, and growing a single crystal having a hole concentration in the range of $4\times10^{15}$ cm$^{-3}$ to $1\times10^{18}$ cm$^{-3}$ from the melt.

The invention of claim 8 is the method for producing a compound semiconductor single crystal ingot for a photoelectric conversion device according to claim 7, wherein the at least one group 1A element is sodium, and the pot is filled with the raw material and sodium telluride.

The invention of claim 9 is the method for producing a compound semiconductor single crystal ingot for a photoelectric conversion device according to claim 8, wherein the at least one group 1A element is sodium and lithium, and the pot is filled with the raw material, sodium telluride, and lithium telluride.

The invention of claim 10 is the method for producing a compound semiconductor single crystal ingot for a photoelectric conversion device according to claim 7, wherein the at least one group 1A element is lithium, and the pot is filled with the raw material and lithium telluride.

The invention of claim 12 is the method for producing a compound semiconductor single crystal ingot for a photoelectric conversion device according to claim 7, wherein the pot is composed of boron nitride.

The invention of claim 13 is the method for producing a compound semiconductor single crystal ingot for a photoelectric conversion device according to claim 7, wherein the pot is composed of quartz.

The invention of claim 14 is the method for producing a compound semiconductor single crystal ingot for a photoelectric conversion device according to claim 7, wherein the melt is solidified by a vertical gradient freeze (VGF) process.

Advantageous Effects of the Invention

According to the present invention, any amount of group 1A element can readily be diffused into a single crystal using a stable group 1A element reacting with part of a raw material. Hence, the hole concentration in a compound semiconductor single crystal ingot of cadmium telluride or cadmium zinc telluride for a photoelectric conversion device can be increased to the range of $4\times10^{15}$ cm$^{-3}$ to $1\times10^{18}$ cm$^{-3}$ which cannot be achieved by any conventional method involving diffusion of impurities from the quartz component.

Accordingly, the conversion efficiency of a photoelectric conversion device using a substrate cut out from the compound semiconductor single crystal ingot of cadmium telluride or cadmium zinc telluride containing at least one group 1A impurity element can be improved.

BRIEF DESCRIPTION OF DRAWINGS

FIG. 1 is a longitudinal sectional view of a photoelectric conversion device according to an embodiment of the present invention.

EMBODIMENTS FOR CARRYING OUT THE INVENTION

First Embodiment

A first embodiment of the present invention will now be described in detail.
[Configuration of Photoelectric Conversion Device]
An overview configuration of a photoelectric conversion device of the present embodiment will be described. FIG. 1 is a schematic longitudinal sectional view of a photoelectric conversion device 10 of the present embodiment. In each layer, the upper surface (the surface facing Sun "S") is defined as a "front surface" and the lower surface as a "rear surface" in FIG. 1.

The photoelectric conversion device 10 of the present embodiment includes a p-type semiconductor substrate (hereafter "p-type substrate 2") cut out from a compound semiconductor single crystal for a photoelectric conversion device of the present embodiment, an n-type semiconductor layer (hereafter "n-type layer 3") formed on the front surface (first main surface 2a) of the p-type substrate 2, a front electrode (first electrode) formed on the front surface of the n-type layer 3, a rear electrode 5 (second electrode) formed on the rear surface (second main surface 2b) of the p-type substrate 2.

The p-type substrate 2 of the present embodiment is a plate made of a single crystal of a group II-VI compound semiconductor, such as cadmium telluride (CdTe) or cadmium zinc telluride (CdZnTe). The CdTe or CdZnTe single crystal contains a group 1A element, specifically sodium (Na) or lithium (Li), as a dopant (impurity), and has a hole concentration in the range of $4\times10^{15}$ cm$^{-3}$ to $1\times10^{18}$ cm$^{-3}$. Hereafter, both CdTe and CdZnTe are collectively referred to as Cd(Zn)Te unless their distinction is necessary.

The n-type layer 3 is a thin film made of a single crystal of, for example, cadmium sulfide (hereafter "CdS").

The front electrode 4 is a thin film made of a transparent conductive material of, for example, indium tin oxide (ITO).

The rear electrode 5 is, for example, a graphite plate.
[Method for Producing Compound Semiconductor Crystal for Photoelectric Conversion Device]
A method for producing a Cd(Zn)Te single crystal 1 will be described. This method involves preparatory, heating, and single crystal growing steps.

In the preparatory step, a quartz crucible (hereafter merely "crucible"), which is a heat-resistant pot, is filled with raw materials (Cd and Te or Cd, Te, and Zn) for the Cd(Zn)Te single crystal and further sodium telluride (Na$_2$Te) or lithium telluride (Li$_2$Te). Na in Na$_2$Te or Li in Li$_2$Te will function as a dopant in the Cd(Zn)Te single crystal later. Although the surface of elemental Na reacts with oxygen to be oxidized, the oxidation of Na and Li can be prevented by filling them as a telluride of Na or Li (one reacting with part of the raw materials). In particular, elemental Li is difficult to handle because it highly reacts with oxygen, but this method can make this filling operation safe. This crucible is then placed in a quartz ampule (hereafter "ampule"). After that, the inside of the ampule is evacuated, and the opening of the quartz ampule is melt-sealed. The ampule is then placed in a single crystal growing furnace.

After the placement of the ampule, the process proceeds to the heating step. In this step, the ampule is heated to melt the raw materials. In the present embodiment, the Cd(Zn)Te single crystal is grown by a VGF method in a VGF furnace as a single crystal growing furnace. After the placement of the ampule and the seal of the VGF furnace, the temperature in the VGF furnace is increased to melt the raw materials, Cd and Te or Cd, Te, and Zn, into the Cd(Zn)Te melt (hereafter "melt"). $Na_2Te$ or $Li_2Te$ filled in the crucible, then, dissociates, and Na or Li diffuses into the melt. Na or Li contained in the quartz component of the crucible also diffuses into the melt.

After Na or Li is sufficiently diffused into melt, the process proceeds to the single crystal growing step. In this step, a heater in the VGF furnace is adjusted such that the temperatures is low at the upper portion of the crucible placed in the furnace and high at the lower portion thereof to form a temperature distribution gradient in the furnace. While the temperature distribution gradient is being formed, the temperature of the melt is gradually lowered to grow the Cd(Zn)Te single crystal downward from the liquid surface of the melt.

An Cd(Zn)Te single crystal ingot (hereafter "ingot") of the present embodiment containing Na or Li as an impurity is produced through the above-described steps, the ingot having a high hole concentration in the range of $4\times10^{15}$ cm$^{-3}$ to $1\times10^{18}$ cm$^{-3}$, and is suitable for photoelectric conversion device substrates.

[Production of Photoelectric Conversion Device]

A method for producing the photoelectric conversion device 10 of the present embodiment including the p-type substrate 2 made of the Cd(Zn)Te single crystal will be described. The method for producing the photoelectric conversion device 10 involves a cutting step, a lapping step, a step of forming an n-type layer, a step of forming a front electrode, a step of forming a rear electrode, and a dicing step.

In the cutting step, the both upper and lower ends of the ingot are cut off and the surface of the remaining middle portion (straight body portion) of the ingot is cut into a cylindrical shape. The ingot is then cut perpendicular to the single crystal growth direction (parallel to the circular surfaces at the both ends of the ingot) to cut out a plurality of discoidal Cd(Zn)Te wafers (hereafter "wafer 1").

After the wafer 1 is cut out, the process proceeds to the lapping step. In this step, the cut section of the wafer 1 is polished with a lapping abrasive to remove the asperities.

After the cutting section is planarized, the process proceeds to the mirror polishing step. In this step, the lapped surface of the wafer 1 is polished with a mirror polishing abrasive to prepare a mirror finished surface.

After the wafer 1 is polished, the process proceeds to the step of forming the n-type layer. In this step, the wafer 1 and the raw materials, Cd and S, for the n-type layer 3 are placed in a vapor phase epitaxy system. A CdS thin film is then epitaxially grown on the surface of the wafer 1. This thin film is grown into the n-type layer 3 with a predetermined thickness.

After the n-type layer 3 is formed, the process proceeds to the step of forming a front electrode. In this step, the front electrode 4 of an ITO thin film is formed on the surface of the n-type layer 3. The electrode may be formed by any conventional process, including physical vapor deposition (PVD), such as sputtering, film deposition, ion-assisted vacuum deposition; and other deposition, such as chemical vapor deposition (CVD), coating, spin-coating, and spraying.

After the front electrode 4 is formed, the process proceeds to the step of forming a rear electrode. In this step, the rear electrode 5 of a graphite thin film is formed on the surface of the wafer 1. The electrode may be formed by any conventional process including coating and vapor deposition.

After the rear electrode 5 is formed, the process proceeds to the dicing step. In this step, the ends of the wafer 1 provided with the n-type layer 3, the front electrode 4, and the rear electrode 5 are formed on the main surfaces 1a or 1b is trimmed into one photoelectric conversion device 10, or the wafer 1 is divided into a plurality of substrates 1, 1. to cut out a plurality of photoelectric conversion devices 10.

The photoelectric conversion device 10 of the present embodiment is produced through the steps described above. Since the photoelectric conversion device 10 has a hole concentration in the range of $4\times10^{15}$ cm$^{-3}$ to $1\times10^{18}$ cm$^{-3}$, it has a high conversion efficiency compared to conventional devices.

Examples

A CdTe single crystal actually produced by the above-described product ion method will now be described.

A quartz crucible was filled with 3900 g of polycrystalline CdTe raw material and 1 mg of $Na_2Te$, and was placed in an ampule. The ampule was then placed in a VGF furnace to melt the raw material and form a temperature gradient to the melt, so as to grow a single crystal downward from the upper end of the melt.

The observed surface of the produced CdTe single crystal showed no precipitate. The Na and Li concentrations measured in the CdTe single crystal were 1E+16 cm$^{-3}$ and 2E+15 cm$^{-3}$ respectively. The results demonstrate that the CdTe single crystal produced according to the present embodiment does not contain excess concentrations of impurities.

The hole concentration in the produced CdTe single crystal measured by a hall measurement apparatus was about $1\times10^{18}$ cm$^{-3}$ at most and about $4\times10^{15}$ cm$^{-3}$ at least.

As described above, since stable Na or Li reacting with part of Te is used in the present embodiment, any amount of Na or Li can be readily diffused into the single crystal. Thus, the hole concentration in a compound semiconductor crystal for a photoelectric conversion device can be increased to the range of $4\times10^{15}$ cm$^{-3}$ to $1\times10^{18}$ cm$^{-3}$ which cannot be achieved by any conventional process which involves diffusion of the impurity from its quartz component. In particular, because a quartz crucible is used in the present embodiment, Na and Li also diffuse from its quartz component into the melt while the crucible is being heated. In this way, the hole concentration in the compound semiconductor crystal for a photoelectric conversion device can be further increased.

As a result, the conversion efficiency of the photoelectric conversion device 10 made of Cd(Zn)Te single crystal containing Na and Li as an impurity can be improved.

Second Embodiment

A second embodiment of the present invention will now be described. The description on the same components as those in the first embodiment is omitted.

The second embodiment is different from the first embodiment in that a crucible composed of pBN (pyrolytic boron nitride) is used for filling raw materials.

After the step of filling the crucible with the raw materials and the like to the step of sealing the VGF furnace, the temperature in the VGF furnace is increased to melt the raw materials. $Na_2Li$ or $Li_2Te$ filled in the crucible then begins to dissociate, and Na or Li diffuses into the melt. Since the pBN crucible is used in the present embodiment, Na or Li does not diffuse from the crucible.

Thus, the second embodiment using the pBN crucible can achieve a high hole concentration in the range of $4\times10^{15}$ cm$^{-3}$ to $1\times10^{18}$ cm$^{-3}$ in the compound semiconductor crystal for a photoelectric conversion device without diffusion of elements other than Na and Li from the crucible, like the first embodiment.

In particular, since Li has a higher electric activation rate than $Na_2$, the hole concentration can be increased with a small amount of $Li_2Te$ without precipitation, which occurs at high concentrations of impurities.

Third Embodiment

A third embodiment of the present invention will now be described. The description on the same components as those in the first and second embodiments is omitted.

The third embodiment is different from the first and second embodiments in that both of $Na_2Li$ and $Li_2Te$ are used as group 1A elements reacting with part of the raw materials, and the material for a crucible for filling the raw materials is not limited.

After the step of filling the crucible with the raw materials to the step of sealing the VGF furnace, the temperature in the VGF furnace is increased to melt the raw materials. $Na_2Li$ and $Li_2Te$ filled in the crucible then begin to dissociate, and Na and Li diffuse into the melt.

In the third embodiment using both of $Na_2Li$ and $Li_2Te$, the hole concentration in the compound semiconductor crystal for a photoelectric conversion device can be more readily increased to the range of $4\times10^{15}$ cm$^{-3}$ to $1\times10^{18}$ cm$^{-3}$ compared to the first and second embodiments.

Although the invention made by the present inventor has been specifically described based on the embodiments above, the present invention should not be limited to the above-described embodiments, and can be modified without departing from the spirit of the present invention.

For example, the method for producing the CdTe or CdZnTe single crystal is described in the embodiments. The present invention can also be applied to all methods for producing any compound semiconductor crystals for photoelectric conversion devices containing group 1A elements as dopants, including not only polycrystalline CdTe and CdZnTe but also monocrystalline zinc telluride (ZnTe).

In the photoelectric conversion device 10 of the embodiment, the n-type layer 3 of a thin-film is formed on the main surface of a plate made of the Cd(Zn)Te single crystal, but the Cd(Zn)Te thin layer may be formed on a surface made of, for example, a glass, on which the n-type layer 3 may be formed. In this case, the polycrystalline Cd(Zn)Te is produced by the method of the present embodiment, from which a thin film can be formed by, for example, a close-spaced sublimation process.

In the embodiments, ITO is used for the front electrode. Alternatively, any other transparent and conductive material may be employed. Furthermore, the rear electrode may be composed of a metal or any other conductive material in place of graphite.

The embodiments disclosed herein are all for illustration only in all respects and not intended to be limiting. The scope of the present invention should be defined not by the above description but by the appended claims, and all modifications are intended to be included without departing from the meaning and scope equivalent to the claims.

INDUSTRIAL APPLICABILITY

The present invention can applied to the cells of solar batteries, for example.

EXPLANATION OF REFERENCE NUMERALS

10: photoelectric conversion device
2: p-type semiconductor substrate (compound semiconductor single crystal for a photoelectric conversion device, Cd(Zn)Te single crystal)
2a: first main surface
2b: second main surface
3: n-type semiconductor layer
4: front electrode (first electrode)
5: rear electrode (second electrode)

The invention claimed is:

1. A compound semiconductor single crystal ingot of cadmium telluride or cadmium zinc telluride for a photoelectric conversion device containing at least one group 1A impurity element and having a hole concentration in the range of $4\times10^{15}$ cm$^{-3}$ to $1\times10^{18}$ cm$^{-3}$.

2. The compound semiconductor single crystal ingot for a photoelectric conversion device according to claim 1, wherein the at least one group 1A element comprises sodium and the concentration of the sodium ranges from $2\times10^{15}$ cm$^{-3}$ to $1\times10^{20}$ cm$^{-3}$.

3. The compound semiconductor single crystal ingot for a photoelectric conversion device according to claim 2, wherein the at least one group 1A element comprises sodium and lithium and the concentration of the lithium ranges from $2\times10^{15}$ cm$^{-3}$ to $1\times10^{20}$ cm$^{-3}$.

4. The compound semiconductor single crystal ingot for a photoelectric conversion device according to claim 1, wherein the at least one group 1A element comprises lithium and the concentration of the lithium ranges from $2\times10^{15}$ cm$^{-3}$ to $1\times10^{20}$ cm$^{-3}$.

5. A photoelectric conversion device: comprising
a p-type semiconductor substrate cut out from a compound semiconductor single crystal ingot for a photoelectric conversion device according to claim 1,
an n-type semiconductor layer formed on a first main surface of the p-type semiconductor substrate,
a first electrode formed on a surface of the n-type semiconductor layer, and
a second electrode formed on a second main surface of the p-type semiconductor substrate.

6. A method for producing a compound semiconductor single crystal ingot of cadmium telluride or cadmium zinc telluride for a photoelectric conversion device containing at least one group 1A impurity element, the method comprising:
filling a heat-resistant pot with a raw material and a group 1A element combined with part of the raw material,
melting the raw material to obtain a melt by heating the pot, and diffusing the dissociated group 1A element into the melt, and
growing a single crystal having a hole concentration in the range of $4\times10^{15}$ cm$^{-3}$ to $1\times10^{18}$ cm$^{-3}$ from the melt.

7. The method for producing a compound semiconductor single crystal ingot for a photoelectric conversion device according to claim 6, wherein
the at least one group 1A element is sodium, and
the pot is filled with the raw material and sodium telluride.

8. The method for producing a compound semiconductor single crystal ingot for a photoelectric conversion device according to claim 7, wherein
the at least one group 1A element is sodium and lithium, and
the pot is filled with the raw material, sodium telluride, and lithium telluride.

9. The method for producing a compound semiconductor single crystal ingot for a photoelectric conversion device according to claim 6, wherein
the at least one group 1A element is lithium, and the pot is filled with the raw material and lithium telluride.

10. The method for producing a compound semiconductor single crystal ingot for a photoelectric conversion device according to claim 6, wherein the pot is composed of boron nitride.

11. The method for producing a compound semiconductor single crystal ingot for a photoelectric conversion device according to claim 6, wherein the pot is composed of quartz.

12. The method for producing a compound semiconductor single crystal ingot for a photoelectric conversion device according to claim 6, wherein the melt is solidified by a vertical gradient freeze process.

\* \* \* \* \*